(12) United States Patent
Hu et al.

(10) Patent No.: US 8,860,148 B2
(45) Date of Patent: Oct. 14, 2014

(54) STRUCTURE AND METHOD FOR FINFET INTEGRATED WITH CAPACITOR

(75) Inventors: Chia-Hsin Hu, Chuanghua (TW); Sun-Jay Chang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/444,623

(22) Filed: Apr. 11, 2012

(65) Prior Publication Data
US 2013/0270620 A1  Oct. 17, 2013

(51) Int. Cl.
*H01L 27/088* (2006.01)

(52) U.S. Cl.
USPC .......................... 257/401; 257/369

(58) Field of Classification Search
USPC ............... 257/401, 190, 369, 296, E29.051, 257/E27.06, E21.619; 438/151, 197, 306
See application file for complete search history.

(56) References Cited

U.S. PATENT DOCUMENTS

| | | | | |
|---|---|---|---|---|
| 7,719,043 B2* | 5/2010 | Yamagami et al. | ........... | 257/308 |
| 2009/0283837 A1* | 11/2009 | Huebinger et al. | ........... | 257/369 |
| 2011/0068375 A1* | 3/2011 | Jakschik et al. | ........... | 257/255 |
| 2011/0121406 A1* | 5/2011 | Lee et al. | ........... | 257/401 |
| 2011/0269287 A1* | 11/2011 | Tsai et al. | ........... | 438/306 |
| 2013/0069144 A1* | 3/2013 | Mathew et al. | ........... | 257/330 |
| 2013/0244387 A1* | 9/2013 | Cho | ........... | 438/283 |

* cited by examiner

*Primary Examiner* — Jarrett Stark
*Assistant Examiner* — Shahed Ahmed
(74) *Attorney, Agent, or Firm* — Haynes and Boone, LLP

(57) ABSTRACT

The present disclosure provides one embodiment of a semiconductor structure that includes a semiconductor substrate having a first region and a second region; a shallow trench isolation (STI) feature formed in the semiconductor substrate. The STI feature includes a first portion disposed in the first region and having a first thickness T1 and a second portion disposed in the second region and having a second thickness T2 greater than the first depth, the first portion of the STI feature being recessed from the second portion of the STI feature. The semiconductor structure also includes a plurality of fin active regions on the semiconductor substrate; and a plurality of conductive features disposed on the fin active regions and the STI feature, wherein one of the conductive features covers the first portion of the STI feature in the first region.

13 Claims, 14 Drawing Sheets

STRUCTURE AND METHOD FOR FINFET INTEGRATED WITH CAPACITOR

BACKGROUND

Integrated circuits have progressed to advanced technologies with high packing densities and smaller feature sizes, such as 45 nm, 32 nm, 28 nm and 20 nm. In these advanced technologies, three dimensional transistors each having a multi-fin structure are often desired for enhanced device performance. However, existing methods and structures for such structures have various concerns and disadvantages associated with device quality and reliability. For example, various defects or resides can be introduced during the polysilicon etch. In another example, a capacitor structure is not easily integrated with a fin transistor while still maintaining a capability of tuning its capacitance in an acceptable range. Furthermore, the fabrication cost is higher due to additional process steps, such as the need for an additional mask to define one or more features of the capacitor. Therefore, there is a need of a structure and a method making the structure having a fin transistor and a capacitor integrated to address the above concerns.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
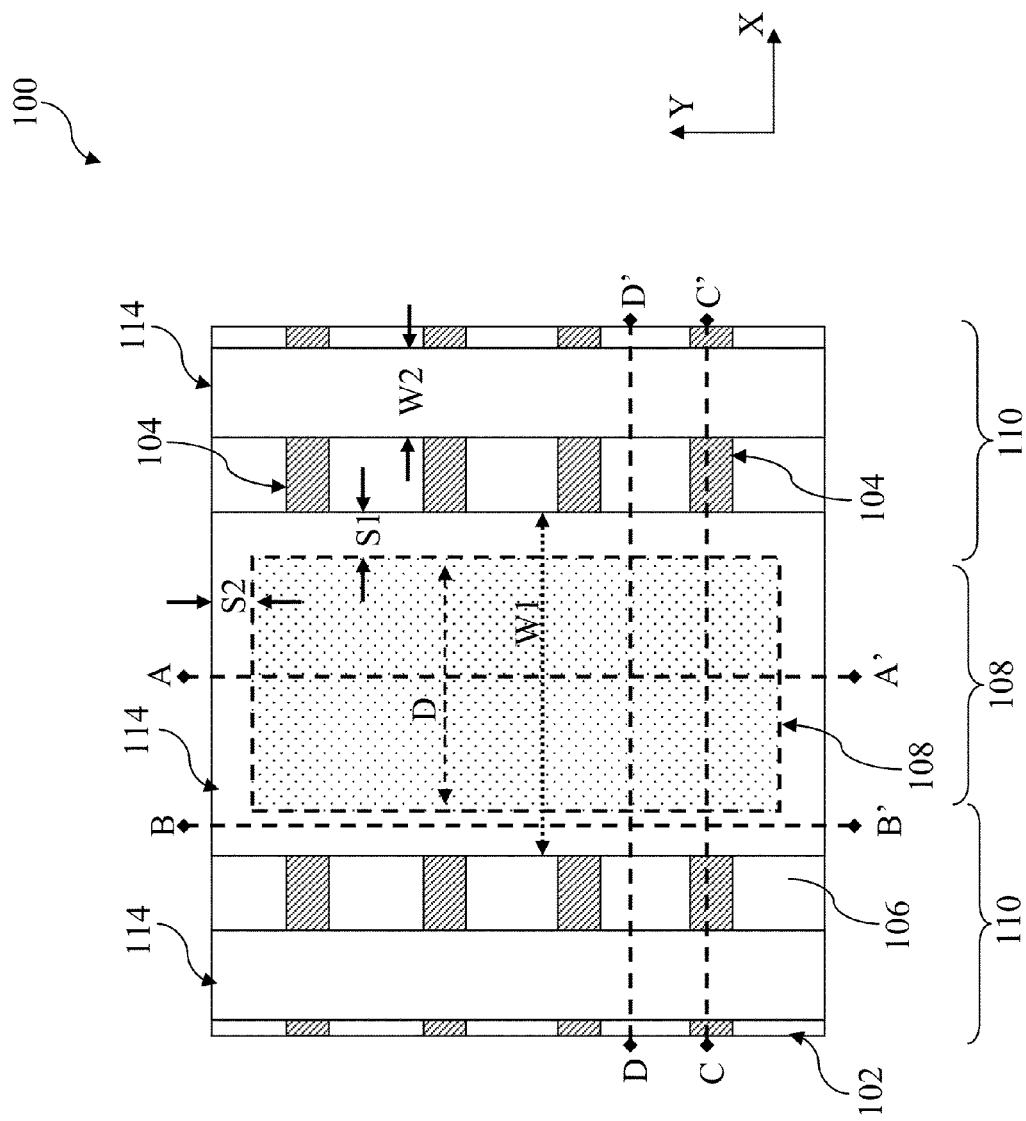
FIG. 1 is a top view of a semiconductor structure having a fin active region and recessed isolation feature constructed according to aspects of the present disclosure in one or more embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 3:
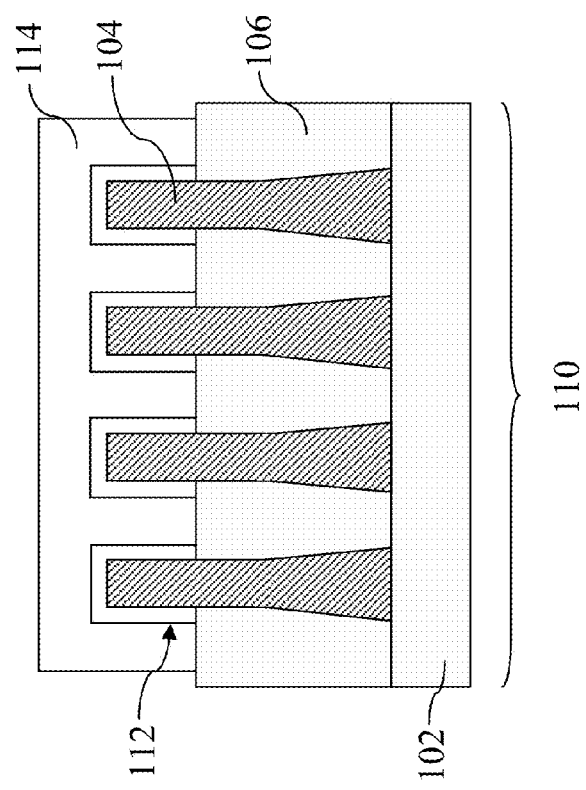
FIGS. 2-5 are sectional views of the semiconductor structure of FIG. 1 constructed according to aspects of the present disclosure in one or more embodiments.
Figure 2:
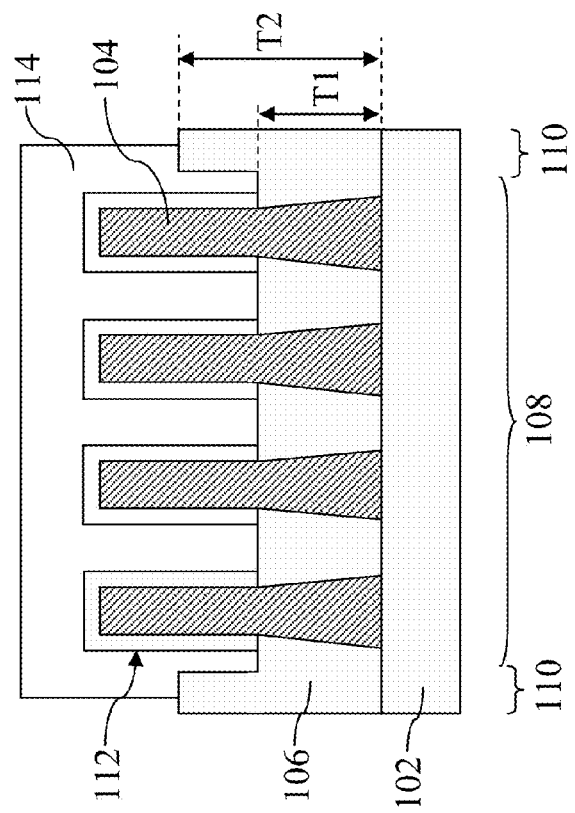
Figure 5:
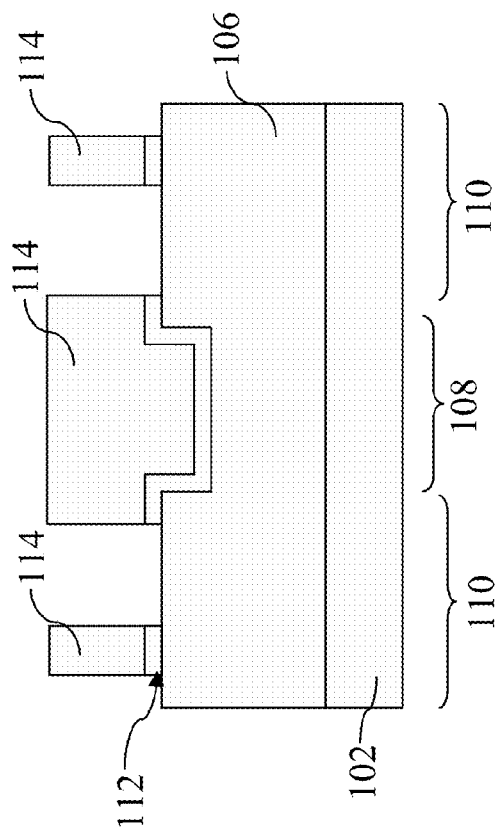
Figure 4:
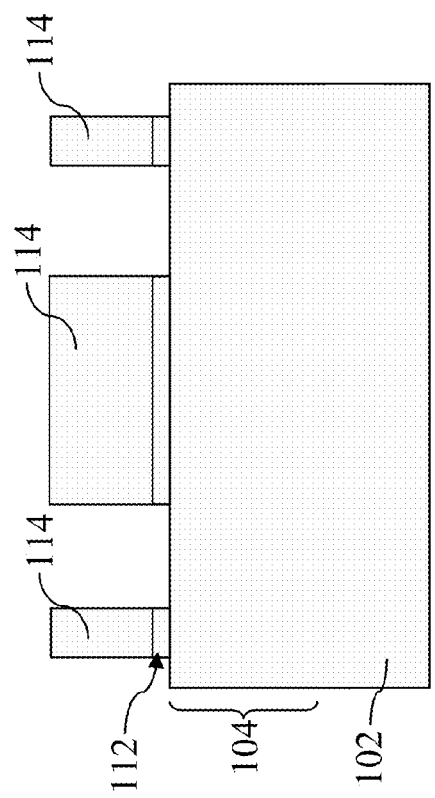

FIG. 1 is a top view of a semiconductor structure 100 having a fin active region and recessed isolation feature. FIGS. 2-5 are sectional views of the semiconductor structure 100. Specifically, FIG. 2 is a sectional view taken from a sectional line AA', FIG. 3 is a sectional view taken from a sectional line BB', FIG. 4 is a sectional view taken from a sectional line CC', and FIG. 5 is a sectional view taken from a sectional line DD'. The semiconductor structure 100 is described with reference to FIGS. 1 through 5.

The semiconductor structure 100 includes a substrate 102. The substrate 102 includes silicon. Alternatively, the substrate 102 includes germanium, silicon germanium or other proper semiconductor materials. The substrate 102 also includes various doped regions. In one embodiment, the substrate 102 includes an epitaxy (or epi) semiconductor layer. In another embodiment, the substrate 102 includes a buried dielectric material layer for isolation formed by a proper technology, such as a technology referred to as separation by implanted oxygen (SIMOX).

The semiconductor substrate 100 includes one or more fin-like active regions (fin active regions) 104 formed on the substrate 102. The fin active regions 104 are active regions of one ore semiconductor materials and are extruded above the top surface of the substrate 102. Thus, the fin active regions 104 are three dimensional active regions having multiple surfaces exposed and providing an efficient way to capacitive-couple a gate electrode to the respective channel in a field effect transistor (FET).

The fin active regions 104 include silicon or other suitable semiconductor material, such as silicon germanium. The fin active regions 104 includes a semiconductor material same to the semiconductor material of the substrate 102. In an alternative embodiment, the fin active regions 104 includes a semiconductor material different from the semiconductor material of the substrate 102, formed by a suitable technique such as epitaxy growth. For example, the substrate 102 includes silicon and the fin active regions include silicon germanium, silicon carbide or both in a proper configuration.

The semiconductor substrate 100 includes shallow trench isolation (STI) feature 106 formed in the substrate to separate various active regions. The STI feature 106 includes one or more dielectric material, such as silicon oxide, silicon nitride, silicon oxynitride, other suitable dielectric material, or combinations. The formation of the STI features may include etching a trench in a substrate and filling the trench by dielectric materials. The filled trench may have a multi-layer structure such as a thermal oxide liner layer with silicon nitride filling the trench. In one embodiment, the STI structure may be created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with oxide, using chemical mechanical planarization (CMP) to etch back, and using nitride etch to remove the nitride layer.

The semiconductor structure 100 includes a first region 108 and a second region 110 adjacent the first region. As illustrated in FIG. 1, the first region 108 is the area defined by a dashed line. The second region 110 includes the rest areas in FIG. 1. In the present embodiment, the first region 108 is surrounded by the second region 110.

Particularly, the STI features 106 in the first region 108 (also referred to as a first portion of the STI feature) are recessed from the STI features 106 in the second region 110 (also referred to as a second portion of the STI feature). As illustrated in FIG. 2, the STI features 106 in the first region 108 has a first thickness T1 and the STI features 106 in the second region 110 has a second thickness T2. The second thickness T2 is greater than the first thickness T1. Furthermore, the top surface of the first portion of the STI feature is below the top surface of the second portion of the STI feature by a distance of (T2-T1).

The semiconductor structure 100 includes one or more dielectric features 112 and conductive features 114. The dielectric features 112 are disposed on the fin active region 104 and the STI feature 106. The conductive features 114 are disposed on the dielectric feature 112. One of the conductive features 114 is configured to cover the first region 108 and cover the fin active regions 104 in the first region 108.

In one embodiment illustrated in FIG. 1, the fin active regions 104 are oriented in a first direction ("X" direction) while the conductive feature 114 are oriented in a second direction ("Y" direction). The two directions are perpendicular from each other.

As illustrated in FIG. 1, the semiconductor structure 100 includes a first conductive feature 114 disposed in the first region 108. The semiconductor structure 100 includes a second and third conductive features 114 disposed in the second region 110. The first conductive feature in the first region 108 has a first width W1 and the second (or third) conductive feature in the second region 110 has a first width W2 different from the first width W1. Particularly, W1 is greater than W2. Accordingly, a first, second and third dielectric features are referred to those underlying the first, second and third conductive features, respectively.

The first conductive feature 114 is designed to cover the first region 108. In this example illustrated in FIG. 1, the first region has a dimension D along the first direction. W1 is greater than D for the full coverage. Furthermore, the first conductive feature 114 is extended to the second region 110 in the first direction (X direction) by a dimension S1 and is extended to the second region 110 in the second direction (Y direction) by a dimension S2 such that the first region 108 is covered by the first conductive feature.

The dielectric feature 112 are aligned with the conductive feature 114 and separate the conductive features 114 from the fin active regions 104. In one example, the dielectric feature 112 and the conductive feature 114 are formed by a procedure that includes depositing a dielectric layer on the substrate 102, depositing a conductive layer on the dielectric layer, and patterning the dielectric layer and the conductive layer to form various dielectric features 112 and conductive features 114 using a lithography process and etch.

In one embodiment, the first conductive features, the first dielectric feature and portion(s) of the fin active regions are configured and coupled to form a capacitor, such as a decouple capacitor, in the first region 108. The second conductive features, the second dielectric feature and other portion(s) of the fin active regions are configured and coupled to form a fin field effect transistor (FinFET).

In the capacitor, the first conductive features, the first dielectric feature and portion(s) of the fin active regions function as a first electrode, capacitor dielectric and a second electrode, respectively. In the field effect transistor, the second conductive features and the second dielectric feature function as gate electrode and gate dielectric, collectively as gate stack. Source and drain features are formed on the other portion(s) of the fin active regions and are interposed by the gate stack.

Since the capacitor is formed in a fin active region, it is compatible with the transistor in term of fabrication. Additionally, the capacitor is formed in the recessed portion of the STI feature, the capacitor area is further increased without increasing the corresponding substrate area occupied by the capacitor. Furthermore, as the width W1 of the first conductive feature is greater than the width of the second conductive feature, the capacitor area is even increased further for more greater range to tune the capacitance.

In one embodiment, the first dielectric feature as the capacitor dielectric includes a first dielectric material and the second dielectric feature as the gate dielectric includes a second dielectric material. The first and second dielectric materials are same or alternatively different from each other. For example, the gate dielectric may use one of silicon oxide, high k dielectric material and combination tuned for the transistor performance. The capacitor dielectric may use another one of silicon oxide, high k dielectric material, and low k dielectric material tuned for proper capacitance.

In another embodiment, the first dielectric feature as the capacitor dielectric includes a first thickness and the second dielectric feature as the gate dielectric includes a second thickness. The first and second dielectric thicknesses are same or alternatively different to be tuned for respective device performance.

In the case where the gate dielectric and capacitor dielectric have different compositions, different thicknesses, or both, they are formed separately. In the case where the gate dielectric and capacitor dielectric have a same composition and a same thickness, they are formed simultaneously by a same procedure.

In an alternative embodiment, the first conductive features, the first dielectric feature and portion(s) of the fin active regions are configured and coupled to form a first FinFET in the first region 108. In this case, the first conductive feature and the first dielectric feature function as gate electrode and gate dielectric, respectively, collectively referred to as a first gate stack. The second conductive features, the second dielectric feature and other portion(s) of the fin active regions are configured and coupled to form a second FinFET. The gate stack of the second FinFET is also referred to as a second gate stack.

In one embodiment, the first dielectric feature as gate dielectric for the first FinFET includes a first dielectric material and the second dielectric feature as the gate dielectric for the second FinFET includes a second dielectric material. The first and second dielectric materials are same or alternatively different from each other.

In another embodiment, the first dielectric feature includes a first thickness and the second dielectric feature includes a second thickness. The first and second dielectric thicknesses are same or alternatively different to be tuned for respective device performance.

In the case where the gate dielectric and capacitor dielectric have a same composition and a same thickness, they are formed simultaneously by a same procedure. In the case where the first dielectric feature and the second dielectric feature have different compositions, different thicknesses, or both, they are formed separately. Further, first and second FinFET may be configured for different function. In one example, the first FinFET is configured as an I/O device and the second FinFET is configured as a core device. In furtherance of the example, the first dielectric feature is thicker than the second dielectric feature.

Figure 6:
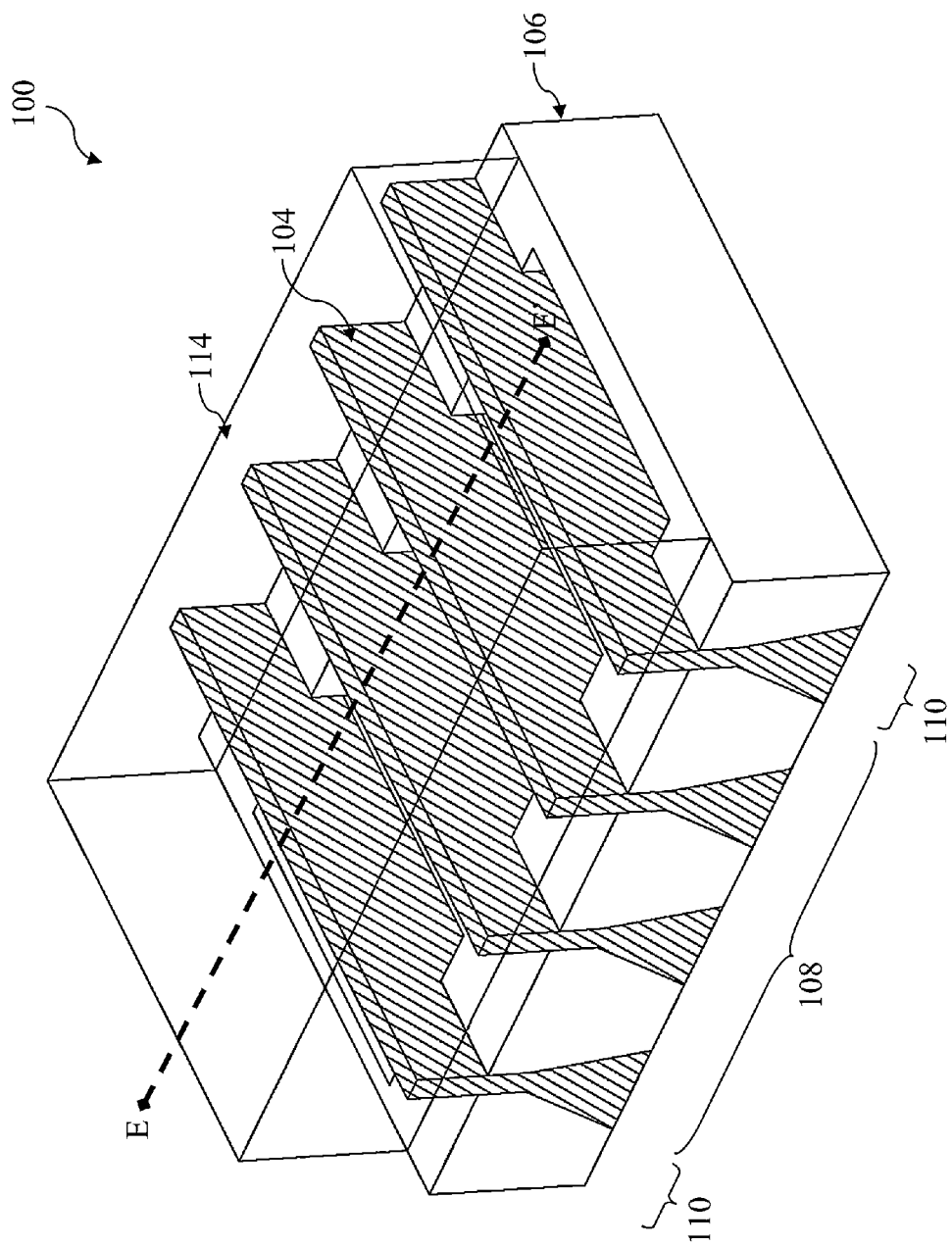
FIG. 6 is a fragmentary perspective view of the semiconductor structure of FIG. 1 constructed according to aspects of the present disclosure in one or more embodiments.
Figure 7:
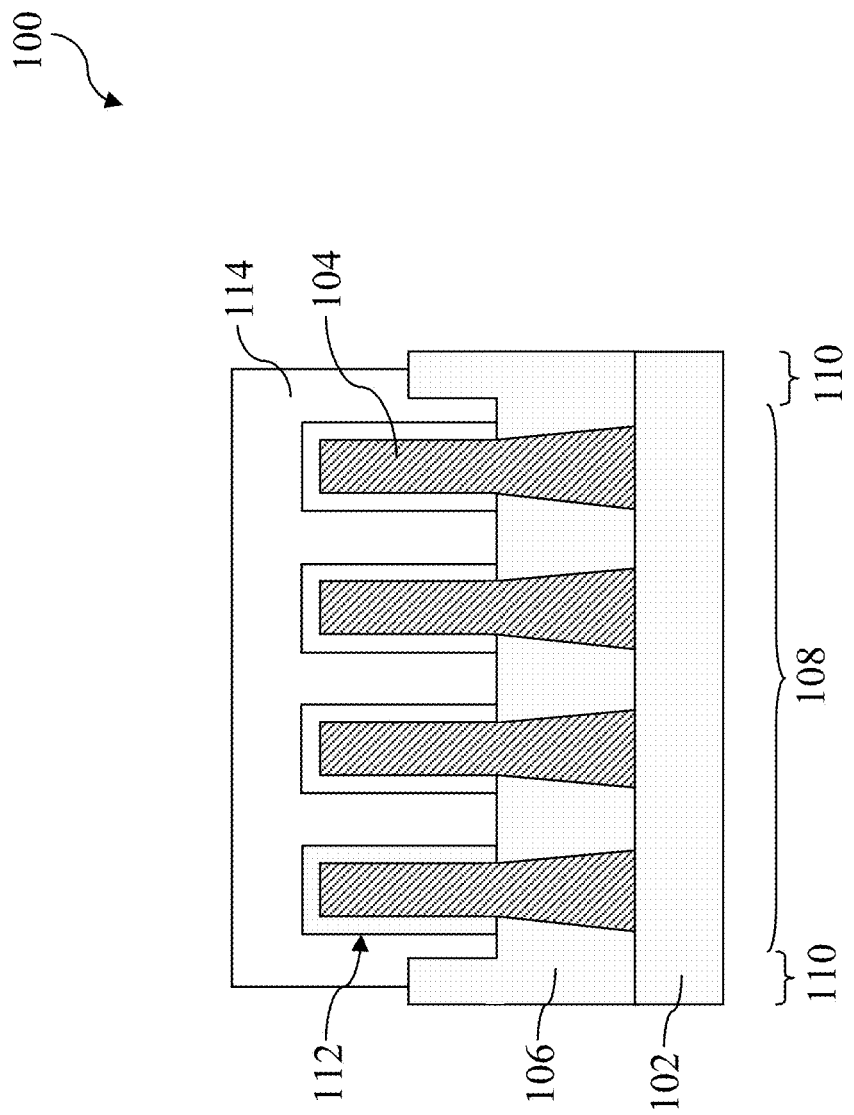
FIG. 7 is a sectional view of the semiconductor structure of FIG. 6 constructed according to aspects of the present disclosure in one embodiment.

FIG. 6 is a fragmentary perspective view of the semiconductor structure 100 constructed according to aspects of the present disclosure in one embodiment. FIG. 7 is a sectional view of the semiconductor structure 100 of FIG. 6 along the dashed line EE'. It is 106 in the first region 108 is recessed and the corresponding fin active regions 104 in the first region 108 are extended deep into the recess. Particularly, the conductive feature 114 covers the recess in the first region 108 and extends to the second region to ensure the full coverage.

Figure 8:
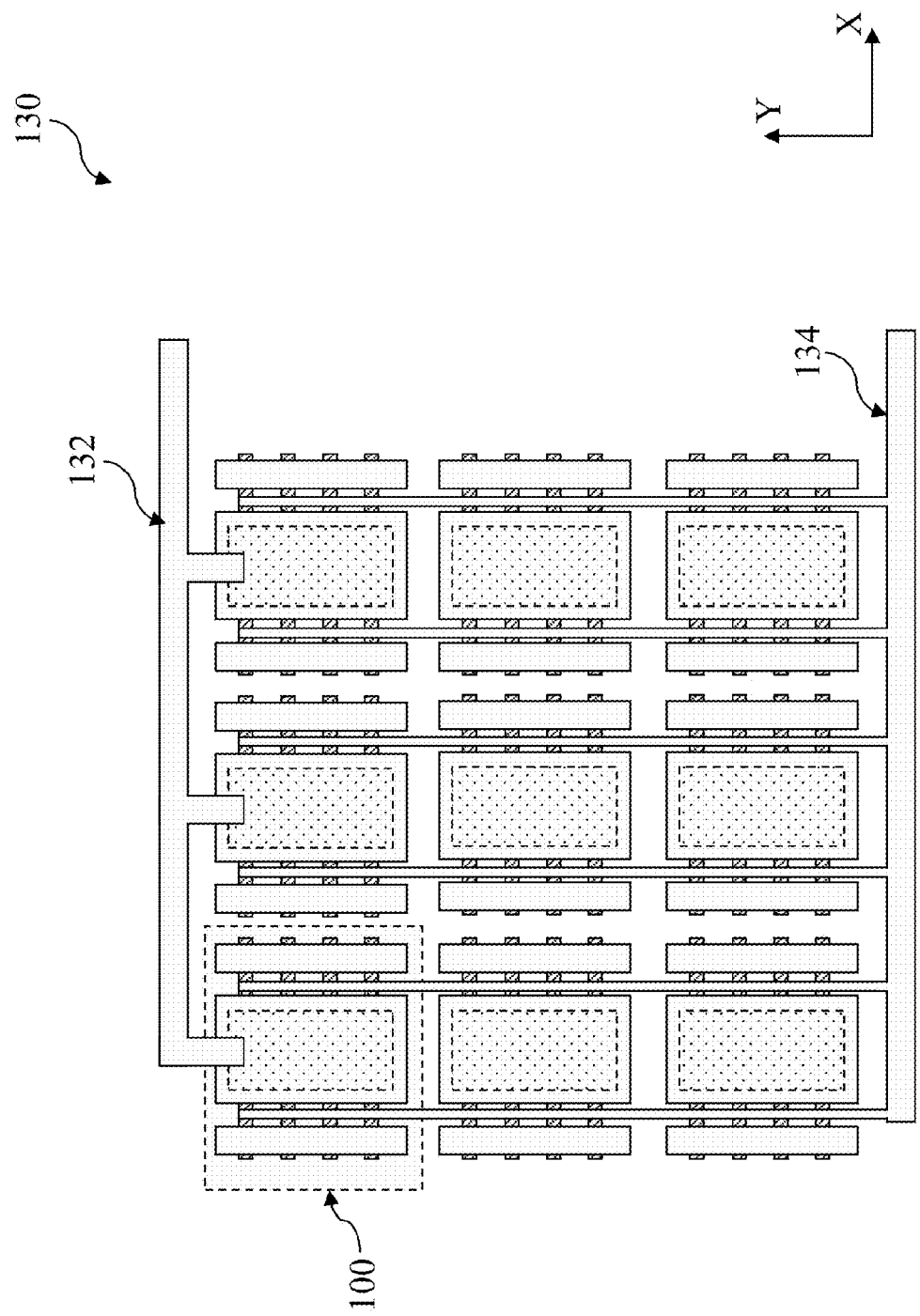
FIG. 8 is a top view of a semiconductor structure constructed according to aspects of the present disclosure in another embodiment.

FIG. 8 is a top view of a semiconductor structure 130 constructed according to aspects of the present disclosure in another embodiment. The semiconductor structure 130 includes a plurality of cells 100 configured in an array. Each cell 100 includes a semiconductor structure 100 of FIG. 1. In the present example for illustration, the semiconductor structure 130 includes 3 columns and 3 rows, forming 3×3 array of cells 100. According to one embodiment, a capacitor is formed in the recessed first region 108 of the semiconductor structure 100. In this embodiment, the conductive features as the first electrodes are connected to a first power line 132 with a first electric voltage, such as a high voltage. The fin active regions as the second electrodes are connected to a second power line 134 with a second electric voltage, such as a low voltage. By different routing, the capacitors in respective cells may be connected in series, in parallel or a hybrid connection.

Figure 9:
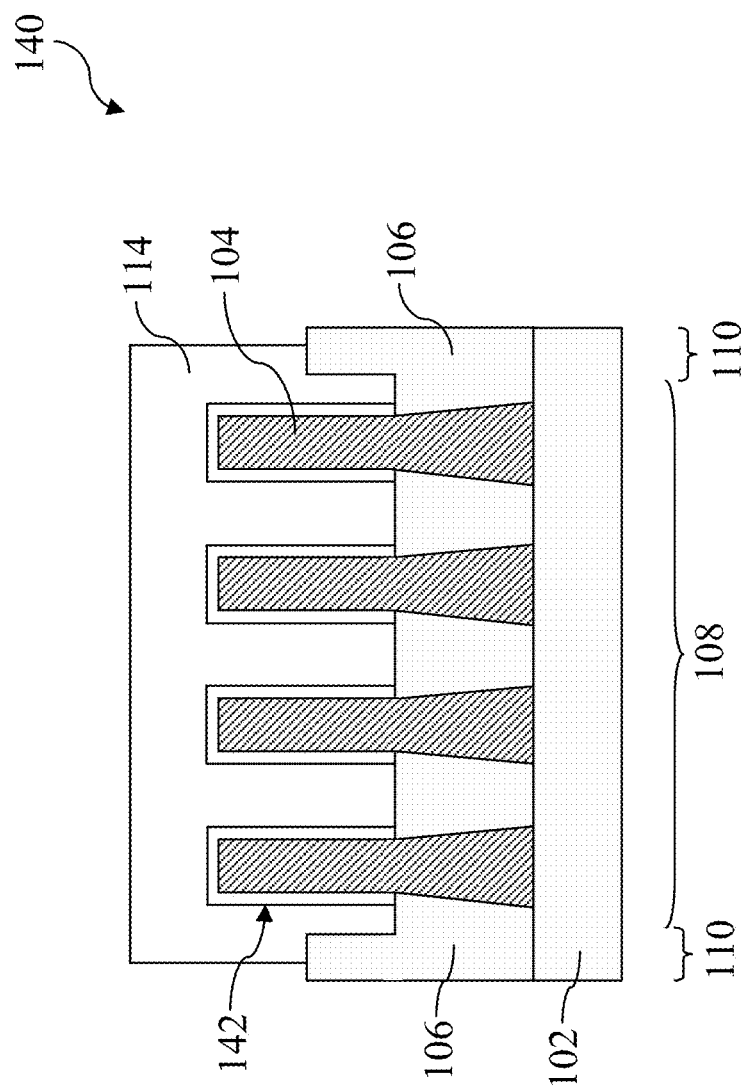
FIGS. 9 and 10 are sectional views of a semiconductor structure constructed according to aspects of the present disclosure in one or more other embodiments.
Figure 10:
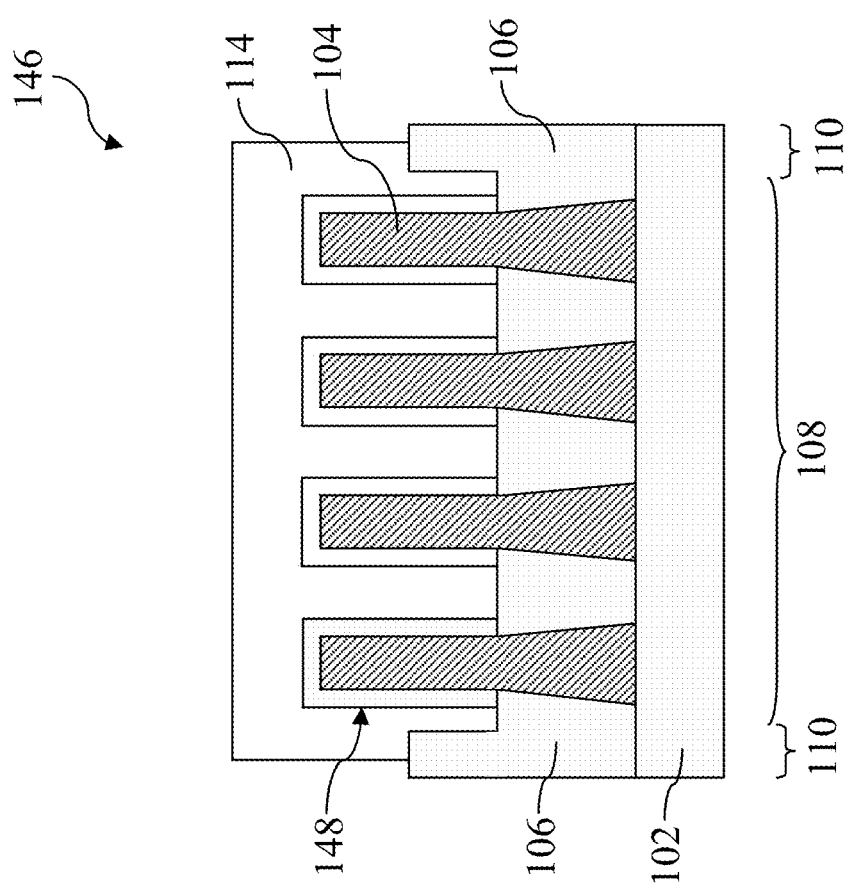

FIGS. 9 and 10 are sectional views of semiconductor structures 140 and 146 constructed according to various embodiments. The semiconductor structure 140 of FIG. 9 is similar to the semiconductor structure 100 of FIG. 1 and the corresponding sectional view in FIG. 2. For example, the semiconductor structure 140 includes in active regions 104 and the STI feature 106 formed on the substrate 102. The substrate 102 includes a first region 108 and a second region 110. The STI feature in the first region 108 is recessed from the STI feature in the second region 110. A dielectric feature 142 is formed on the substrate 102 and a conductive feature 114 is formed on the dielectric feature 142. The conductive feature 114 covers the first region 108, especially covering the recessed STI features within the gaps between the fin active regions.

In the semiconductor structure 140 of FIG. 9, the conductive features 114, the dielectric feature 142 and the fin active regions 104 are configured and coupled to form a FinFET (referred to as FinFET 140). In this case, the conductive feature 114 and the dielectric feature 142 function as gate electrode and gate dielectric, respectively.

The semiconductor structure 146 of FIG. 10 is similar to the semiconductor structure 100 of FIG. 1 and the corresponding sectional view in FIG. 2 as well. For example, the semiconductor structure 146 includes in active regions 104 and the STI feature 106 formed on the substrate 102. The substrate 102 includes a first region 108 and a second region 110. The STI feature in the first region 108 is recessed from the STI feature in the second region 110. A dielectric feature 148 is formed on the substrate 102 and a conductive feature 114 is formed on the dielectric feature 148. The conductive feature 114 covers the first region 108.

In the semiconductor structure 146 of FIG. 10, the conductive features 114, the dielectric feature 142 and the fin active regions 104 are configured and coupled to form another FinFET (referred to as FinFET 146). In this case, the conductive feature 114 and the dielectric feature 148 function as gate electrode and gate dielectric, respectively.

In the present embodiment, an integrated circuit includes both the FinFET 140 and the FinFET 146 formed in the same substrate 102. However, the dielectric feature 142 as the gate dielectric for the FinFET 140 includes a first thickness and the dielectric feature 148 as the gate dielectric for the FinFET 146 includes a second thickness greater than the first thickness. In one example, the FinFET 146 is configured as an I/O device and the FinFET 140 is configured as a core device.

Figure 11:
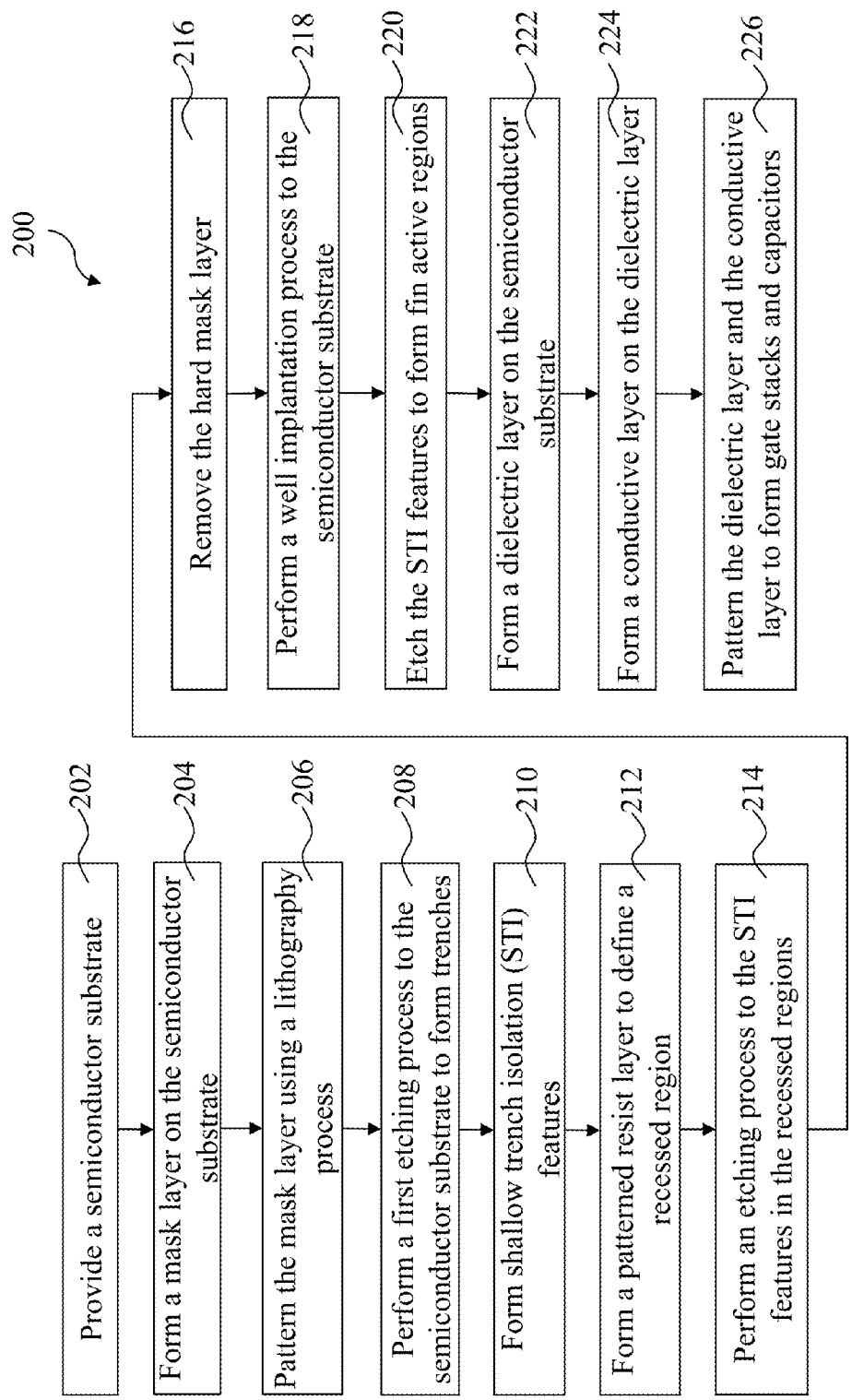
FIG. 11 is a flowchart of a method making a semiconductor structure of FIG. 1 constructed according to various aspects of the present disclosure in one embodiment.

FIG. 11 is a flowchart of a method 200 for making a semiconductor device constructed according to an embodiment of the present invention. The semiconductor device includes a multi-fin structure and a dual depth isolation structure. FIGS. 12 through 21 are sectional views of an embodiment of a semiconductor structure 300 at various fabrication stages. The semiconductor structure 300 and the method 200 of making the same are collectively described with reference to FIGS. 12 through 21. The semiconductor structure 300 is provided for illustration of the method 200 and is similar to the semiconductor 100 of FIG. 1. Therefore, the similar features are described concisely for simplicity.

Figures 12, 13:
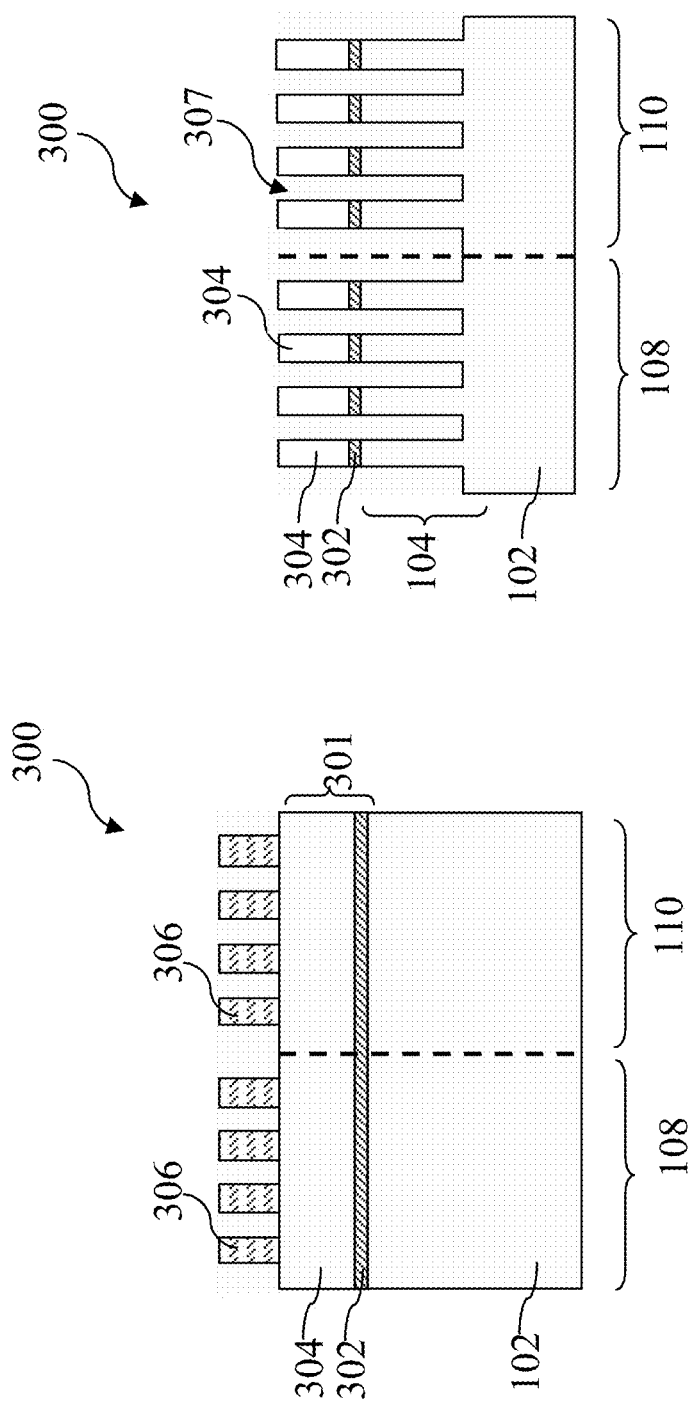
FIGS. 12-21 are sectional views of a semiconductor structure at various fabrication stages constructed according to the method of FIG. 11.

Referring to FIGS. 11 and 12, the method 200 begins at step 202 by providing a semiconductor substrate 102. The semiconductor substrate 102 includes silicon. Alternatively, the substrate 102 includes germanium, silicon germanium or other proper semiconductor materials.

Still referring to FIGS. 11 and 12, the method 200 proceeds to step 204 by forming a mask layer 301. The mask layer 301 is a hard mask layer having one or more suitable dielectric materials. In the present embodiment, the mask layer 301 includes a silicon oxide (SiO) layer 302 formed on the substrate 102 and a silicon nitride (SiN) layer 304 formed on the silicon oxide layer 302. In one example, the SiO layer 214 includes a thickness ranging between about 5 nm and about 15 nm. In another example, the SiN layer 216 includes a thickness ranging between about 40 nm and about 120 nm. In another embodiment, step 204 includes forming the SiO layer 302 by thermal oxidation and forming the SiN layer 304 by chemical vapor deposition (CVD). For example, the SiN layer 304 is formed by CVD using chemicals including Hexachlorodisilane (HCD or $Si_2Cl_6$), Dichlorosilane (DCS or $SiH_2Cl_2$), Bis(TertiaryButylAmino) Silane (BTBAS or $C_8H_{22}N_2Si$) and Disilane (DS or $Si_2H_6$).

The method 200 proceeds to step 206 by patterning the mask layer 301 by a procedure including a lithography patterning process and an etching process. In the present embodiment as illustrated in FIG. 12, a patterned photoresist layer 306 is formed on the hard mask layer 301 using a photolithography process including photoresist coating, soft baking, exposing, post-exposure baking (PEB), developing, and hard baking.

Referring to FIG. 13, the mask layer 301 is etched through the openings of the patterned photoresist layer 306, forming a patterned mask layer 301, by the etching process. The patterned photoresist layer is removed thereafter using a suitable process, such as wet stripping or plasma ashing. In one example, the etching process includes applying a dry (or plasma) etch to remove the mask layer 301 within the openings of the patterned photoresist layer 306. In another example, the etching process includes applying a plasma etch to remove the SiN layer 304 within the openings of the patterned photoresist layer 306, and a wet etch with a hydrofluoric acid (HF) solution to remove the SiO layer 302 within the openings. In another example, the etching process includes applying a plasma etch to remove the SiN layer 304 within the openings but the SiO layer 302 may remain at this processing stage. Thereafter, the patterned photoresist layer 306 is removed by a proper technique, such as stripping or ashing.

The patterned mask layer 301 includes multiple openings defining fin active regions 104. The fin active regions 104 is configured for various devices, such as a FinFET, a capacitor or both. In the present embodiment, the semiconductor structure 300 includes a first region 108 and a second region 110. In a particular example, a capacitor is formed in the first region 108 and a FinFET is formed in the second region 110. In one example, the FinFET includes a metal-oxide-semiconductor (MOSFET).

Still referring to FIG. 13, the method 200 proceeds to step 208 by performing an etch process to the substrate 102 through the openings of the hard mask 301, forming various trenches 307 in the substrate 102. Various fin active regions 104 are defined by the etch process. In one embodiment, the etch process implements a dry etch. For example, the etchant of the etch process includes plasma HBr, Cl2, SF6, O2, Ar, and He. In another example, the etchant includes plasma CF4, C3F8, C4F8, CHF3, CH2F2, or a combination thereof.

Figure 14:
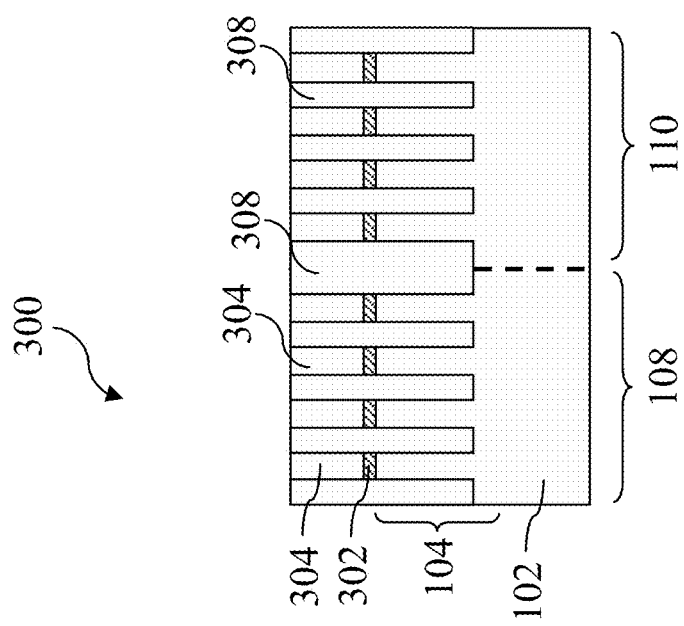

Referring to FIGS. 11 and 14, the method 200 proceeds 210 by forming one or more STI features 308 in the trenches 307. The STI features 308 include one or more dielectric materials filled in the trenches 307. In one embodiment, the formation of the STI features 308 includes dielectric deposition and polishing. In a particular example, the formation of the STI features 308 includes filling the trenches by one or more dielectric materials such as silicon oxide, silicon nitride, or silicon oxynitride. The filled trench may have a multi-layer structure such as a thermal oxide liner layer with silicon nitride filling the trench. In one embodiment, filling various STI features includes growing a thermal oxide trench liner to improve the trench interface, filling the trench with silicon oxide or silicon nitride using a CVD technology, and optionally performing an thermal annealing. In one example, the dielectric deposition uses high density plasma CVD (HD-PCVD). In another example, the polishing may use a chemical mechanical polishing (CMP) process to remove the excessive dielectric materials on the hard mask and planarize the top surface of the semiconductor structure 300.

Figure 15:
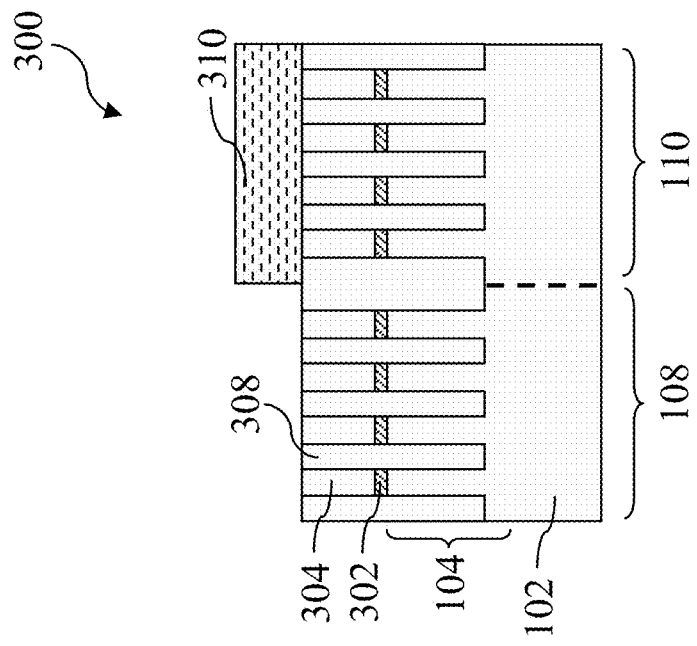

Referring to FIGS. 11 and 15, the method 200 proceeds to step 212 by forming another patterned photoresist layer 310 on the substrate 102 using a lithography process. The patterned photoreisst layer 310 defines a recessed region. Particularly, the patterned photoresist layer 310 is patterned to cover the second region 110 and has an opening to expose the first region 108 that is the area to be recessed.

Figure 16:
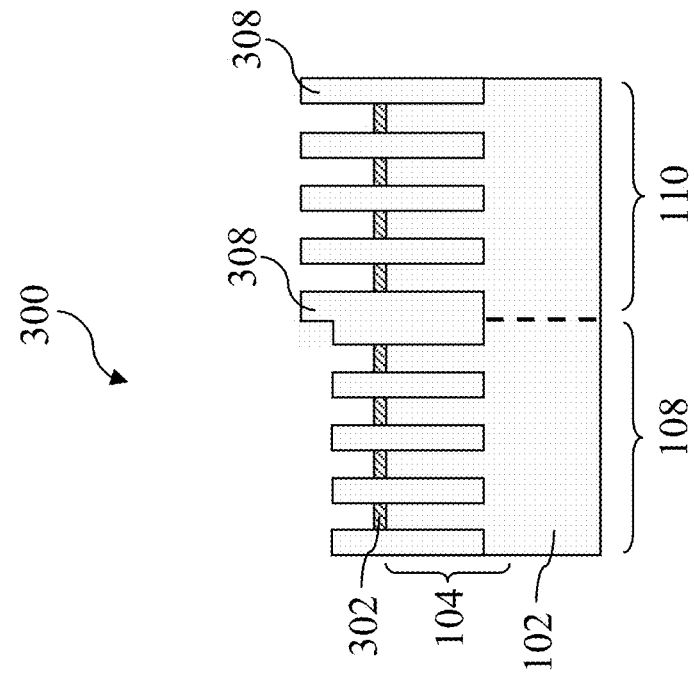

Referring to FIGS. 11 and 16, the method 200 proceeds to step 214 by performing an etch process to the STI features 308 using the patterned photoresist layer 310 as an etch mask. The etch process uses an etchant to selectively etch the STI features 308. Thus, the STI features 308 in the first region 108 are etched back and recessed form the STI features 308 in the second region 110. Thereafter, the patterned photoresist layer 310 is removed.

Figure 17:
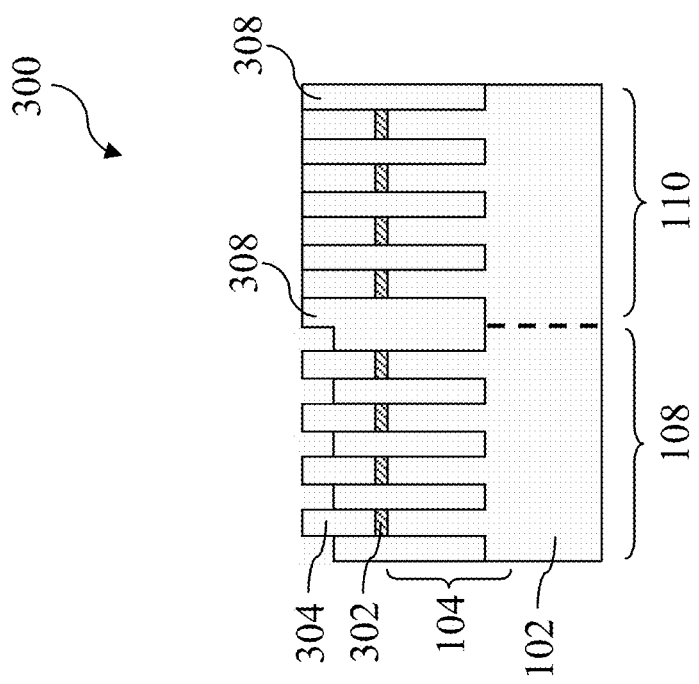

Referring to FIGS. 11 and 17, the method 200 proceeds to step 216 by removing the hard mask 301 by an etch process. In the present embodiment, hard mask 301 is partially removed. Particularly, the SiN layer 304 is removed. The etch process to remove the SiN layer 304 uses an etchant to selectively remove the silicon nitride without etch silicon oxide. In one example, the etchant in this etch process includes a hot phosphoric acid (H3PO4) solution.

Figure 18:
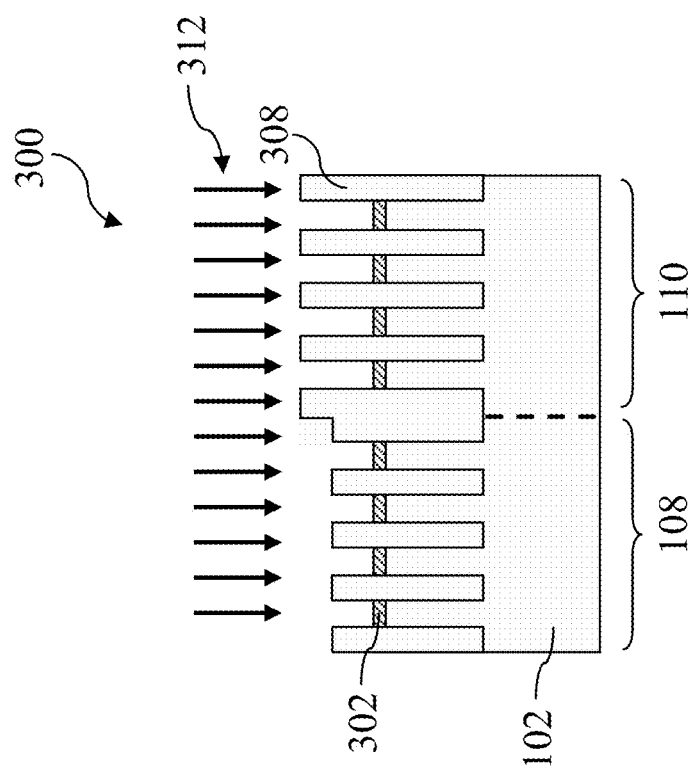

Referring to FIGS. 11 and 18, the method 200 may proceed to step 218 by performing an ion implantation process 312 to the substrate 102, forming various well regions, such as n-wells or p-wells. In the present example, the silicon oxide layer 302 is used as an implantation screen layer for improved implant effect, such as with reduced implantation channeling issue. The implantation process 312 uses proper implanting species and suitable dose. For example, The implanting species may include phosphorous for n-wells or boron for p-wells.

Figure 19:
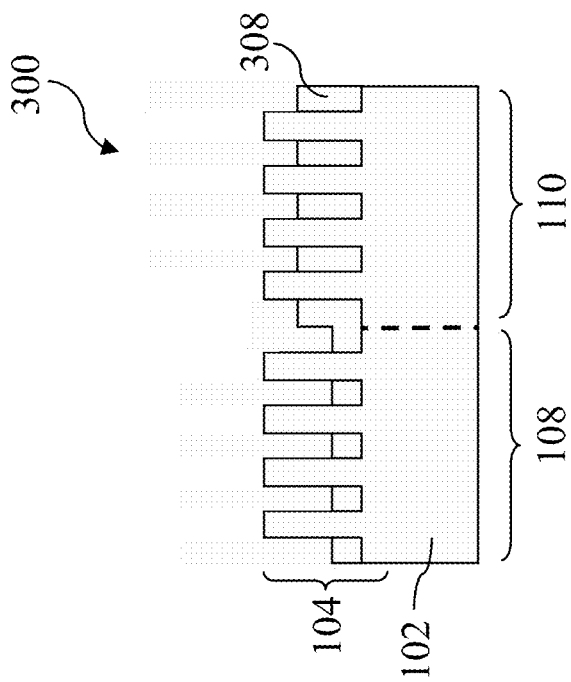

Referring to FIGS. 11 and 19, the method 200 may proceed to step 220 by another etch process to the STI features 308 to etch back the STI features 308 in both the first region 108 and the second region 110. The fin active regions 104 are formed and extruded out from the STI features 308. After step 220, the STI features in the first region 108 are still recessed relatively to the STI features in the second region 110. The etchant used in this step may be similar to the etchant used in the etch process at step 214.

Figure 20:
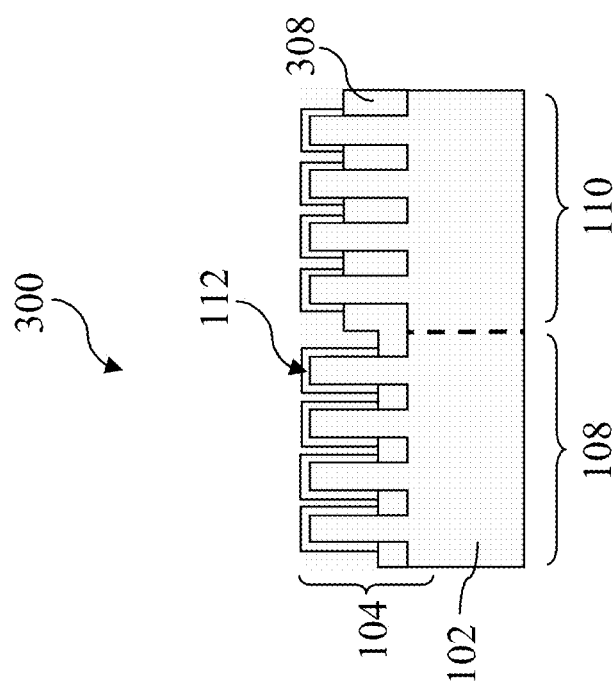

Referring to FIGS. 11 and 20, the method 200 may proceed to step 222 by forming a dielectric layer 112 on the fin active regions 104. The dielectric layer 112 is formed on top surfaces and sidewalls of the fin active regions 104. The dielectric layer 112 may include silicon oxide, high k dielectric material or combinations thereof. The dielectric layer 112 may be formed by a suitable technique, such as thermal oxidation, atomic layer deposition (ALD), metal organic chemical vapor deposition (MOCVD), physical vapor deposition (PVD), or molecular beam epitaxy (MBE). In one example, the dielectric layer 112 includes silicon oxide formed by thermal oxidation applied to the fin active regions 104 that include silicon. In another example, the high k dielectric material is used and includes metal oxide, such as zirconium oxide (ZrO2), aluminum oxide (Al2O3), or hafnium oxide (HfO2). In yet another example, the high k dielectric material is formed by an UV-Ozone Oxidation that includes sputtering to form metal film; and in-situ oxidation of metal film by O2 in presence of ultra-violet (UV) light. In yet another example, the dielectric layer 112 includes a silicon oxide film and a high k dielectric film. When dual dielectric thickness or dual dielectric material is used, the dielectric features with different composition an/or different thickness are formed separately.

Figure 21:
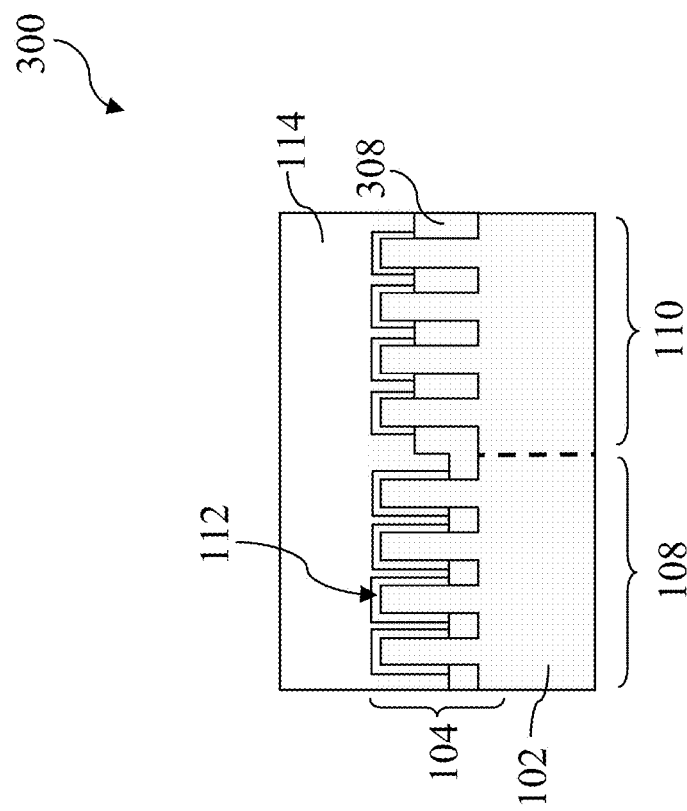

Referring to FIGS. 11 and 21, the method 200 may proceed to step 224 by forming a conductive layer 114 on the dielectric layer 112. The conductive layer 114 includes polysilicon, metal (such as aluminum, copper or tungsten), silicide, other conductive material with proper work functions (for n-type FET and p-type FET, respectively), or a combinations thereof. The conductive layer 114 is formed by a suitable technique, such as PVD.

Still referring to FIGS. 11 and 21, the method 200 may proceed to step 226 by patterning the conductive layer 114 and the dielectric layer 112 to form conductive features and dielectric features, respectively. The patterning of the conductive layer 114 and the dielectric layer 112 includes one or more etch steps. In one example, a hard mask is formed on the conductive layer 114 as an etch mask during the etch process. In another example, a patterned photoresist layer is used as an etch mask to pattern the conductive layer 114 and the dielectric layer 112.

Particularly, the conductive layer 114 is patterned such that one of the conductive features (and the corresponding dielectric feature as well) covers the recessed first region 108. In the present example, the one of the conductive feature in the first region 108 is extended to the second region 110. Since the fin active regions 104 in the recessed first region 108 has a high aspect ratio and is hard to complete the etch of the conductive layer within the gaps of the fin active regions 104, the fully coverage of the recessed first region by the conductive layer 114 avoids the direct etching of the conductive layer in the recessed first region 108.

Other process steps may be implemented before, during or after the method 200. In one embodiment, another procedure to form source and drain regions may be implemented to form one or more FinFETs. In one example, the source and drain regions include light doped drain (LDD) regions and heavily doped source and drain (S/D) features, collectively referred to as source and drain regions, formed by various ion implantation processes. When the semiconductor structure 300 includes both n-type FETs (nFETs) and p-type FETs (pFETs), the source and drain regions are formed for the n-type FETs and the p-type FETs, respectively, using proper doping species. As one example for nFETs, the LDD features are formed by an ion implantation with a light doping dose. Thereafter, spacers are formed by dielectric deposition and anisotropic etch, such as plasma etch. Then the heavily doped S/D features are formed by an ion implantation with a heavy doping dose. The various source and drain features of the pFETs can be formed in a similar procedure but with opposite doping type. In one embodiment of the procedure to form various source and drain features for both nFETs and pFETs, the LDD features of nFETs are formed by an ion implantation while the regions of pFETs are covered by a patterned photoresist layer; the LDD features of pFETs are formed by an ion implantation while the regions of nFETs; then spacers are formed to nFET gate stacks and pFET gate stacks by deposition and etch. the S/D features of nFETs are formed by ion implantation while the regions of pFETs are covered by another patterned photoresist layer; and the S/D features of pFETs are formed by ion implantation while the regions of nFETs are covered by another patterned photoresist layer. In one embodiment, a high temperature annealing process is followed to activate the various doping species in the source and drain regions.

In another embodiment, an inter-level dielectric (ILD) layer is formed on the semiconductor substrate 102. The ILD layer includes silicon oxide, low k dielectric material, other suitable dielectric materials, or combinations thereof. The ILD layer is formed by a suitable technique, such as CVD. For example, a high density plasma CVD can be implemented to form the ILD layer.

In yet another embodiments, various interconnection features are formed to couple various devices to form functional circuits. The interconnection features include vertical interconnects, such as contacts and vias, and horizontal interconnects, such as metal lines. The various interconnection features may use various conductive materials including copper, tungsten and silicide. In one example, a damascene process is used to form copper-based multilayer interconnection structure. In another embodiment, tungsten is used to form tungsten plug in the contact holes. In another example, silicide is used to form various contact on source and drain regions for reduced contact resistance.

In yet another embodiment, a pFET has a strained structure for enhanced carrier mobility and improved device performance. In furtherance of the embodiment, silicon germanium (SiGe) is formed in the source and drain regions of the pFET to achieve a proper stress effect. In another embodiment, an nFET has a strained structure for enhanced carrier mobility and improved device performance. In furtherance of the embodiment, silicon carbide (SiC) is formed in the source and drain regions of the nFET to achieve a proper stress effect.

Although various embodiments of the semiconductor structure and the method making the same are provided. Other alternatives and additions may present without departure from the scope of the present disclosure. The present disclosure may be used in various applications. For example, the semiconductor structure 100 with a FinFET and a capacitor may be used to form static random access memory (SRAM) cells. In other examples, the semiconductor structure 100 may be incorporated in various integrated circuit, such as logic circuit, dynamic random access memory (DRAM), flash memory, or imaging sensor.

Thus, the present disclosure provides one embodiment of a semiconductor structure that includes a semiconductor substrate having a first region and a second region; a shallow trench isolation (STI) feature formed in the semiconductor substrate. The STI feature includes a first portion disposed in the first region and having a first thickness T1 and a second portion disposed in the second region and having a second thickness T2 greater than the first depth, the first portion of the STI feature being recessed from the second portion of the STI feature. The semiconductor structure also includes a plurality of fin active regions on the semiconductor substrate; and a plurality of conductive features disposed on the fin active regions and the STI feature, wherein one of the conductive features covers the first portion of the STI feature in the first region.

In one embodiment of the semiconductor structure, the first portion of the STI feature is recessed from the second portion of the STI feature such that a top surface of the first portion is lower than a top surface of the second portion by (T2-T1).

In another embodiment, the semiconductor structure further includes a plurality of dielectric features underlying the conductive features and separating the conductive feature from the fin active regions.

In yet another embodiment, the semiconductor structure further includes a capacitor disposed in the first region; and a transistor disposed in the second region. The capacitor includes one of the fin active regions, the one of the conductive features, and one of the dielectric layer separating the one of the conductive features from the one of the conductive features. In one example, the capacitor is a de-coupling capacitor and the transistor is a field effect transistor.

In yet another embodiment, the semiconductor structure further includes a first transistor disposed in the first region, wherein the first transistor includes a first gate stack having a first one of the dielectric features and a first one of the conductive features overlying the first one of the dielectric features; and a second transistor disposed in the second region, wherein the second transistor includes a second gate stack having a second one of the dielectric features and a second one of the conductive features overlying the second one of the dielectric features. The first one of the dielectric features has a first thickness, and the second one of the dielectric features has a second thickness different from the first thickness.

In yet another embodiment, the plurality of conductive features include a first conductive feature disposed in the first region and having a first width; and a second conductive feature disposed in the second region and having a second width less than the first width.

In yet another embodiment, the plurality of dielectric features include a first dielectric feature disposed in the first region, underlying the first conductive feature, and having a first dielectric material; and a second dielectric feature disposed in the second region, underlying the second conductive feature, and having a second dielectric material different from the first dielectric material.

In yet another embodiment, the first conductive feature, the first dielectric feature and a first subset of the fin active regions are configured to form a capacitor; and the second conductive feature, the second dielectric feature and a second subset of the fin active regions are configured to form a fin field effect transistor (FinFET).

The present disclosure also provides another embodiment of a semiconductor structure that includes a semiconductor substrate having a first region and a second region; a fin active region formed on the semiconductor substrate and extended in the first and second regions; a shallow trench isolation (STI) feature formed in the semiconductor substrate and adjacent the fin active region. The STI feature includes a first portion disposed in the first region and a second portion disposed in the second region, and the first portion of the STI feature has a first top surface and the second portion of the STI feature has a second top surface higher than the first top surface. The semiconductor structure also includes a first conductive feature formed on the fin active region and the STI feature, wherein the first conductive feature is disposed in the first region and covers the first portion of the STI feature; and a second conductive feature formed on the fin active region and the STI feature, wherein the second conductive feature is disposed in the second region.

In one embodiment, the semiconductor structure further includes a first dielectric feature aligned with the first conductive feature and underlying the first conductive feature; and a second dielectric feature aligned with the second conductive feature and underlying the second conductive feature.

In another embodiment, the fin active region, the first dielectric feature and the first conductive feature are configured and coupled to form a capacitor; and the fin active region, the second dielectric feature and the second conductive feature are configured and coupled to form a field effect transistor.

In yet another embodiment, the first conductive feature includes a first width; and a second conductive feature includes a second width less than the first width.

In yet another embodiment, the first dielectric feature include a first thickness; and the second dielectric feature include a second thickness different from the first thickness.

In yet another embodiment, the first dielectric feature include a first dielectric material; and the second dielectric feature include a second dielectric material different from the first dielectric material.

In yet another embodiment, the fin active region is oriented in a first direction; and the first and second conductive features are oriented in a second direction perpendicular to the first direction.

The present disclosure also provides one embodiment of a method that includes etching a semiconductor substrate to form a plurality trenches and define a plurality of fin active regions; filling in the plurality of trenches with a dielectric material to form shallow trench isolation (STI) features; recessing a first subset of the STI features in a first region by a first dimension; recessing a second subset of the STI features in a second region by a second dimension less than the first dimension; and forming a conductive feature on the STI features and the fin active regions, wherein the conductive features covers the first subset of the STI features.

In one embodiment, the recessing a first subset of the STI features in a first region by a first dimension; and the recessing a second subset of the STI features in a second region include: forming a patterned resist layer on the semiconductor substrate, wherein the patterned resist layer has openings exposing the first region and covers the second region; performing a first STI etch to the first subset of the STI features in the first region through openings of the patterned resist layer; removing the patterned resist layer; and performing a second STI etch to the first subset of the STI features in the first region and the second subset of the STI features in the second region, resulting in the first subset of the STI features is recessed from the second subset of the STI features.

In another embodiment, the method further includes performing a well implantation to the semiconductor substrate after the performing a first STI etch and before the performing a second STI etch.

In another embodiment, the method further includes depositing a hard mask layer on the semiconductor substrate; patterning the hard mask layer using a lithography process, wherein the etching a semiconductor substrate to form a plurality trenches and define a plurality of fin active regions includes etching the semiconductor substrate through openings of the hard mask layer; and removing the hard mask layer after the first STI etch and before the performing a well implantation.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
a semiconductor substrate having a first region and a second region;
a shallow trench isolation (STI) feature formed in the semiconductor substrate, wherein the STI feature includes a first portion disposed in the first region and having a first thickness T1 and a second portion disposed in the second region and having a second thickness T2 greater than the first thickness T1, the first portion of the STI feature being recessed from the second portion of the STI feature;
a plurality of fin active regions on the semiconductor substrate;
a plurality of conductive features disposed on the fin active regions and the STI feature, wherein one of the conductive features covers the first portion of the STI feature in the first region and a portion of the second portion of the STI feature in the second region;
a plurality of dielectric features underlying the conductive features and separating the conductive feature from the fin active regions;
a first transistor disposed in the first region, wherein the first transistor comprises a first gate stack having a first one of the dielectric features and a first one of the conductive features overlying the first one of the dielectric features; and
a second transistor disposed in the second region, wherein the second transistor comprises a second gate stack having a second one of the dielectric features and a second one of the conductive features overlying the second one of the dielectric features,
wherein the first one of the dielectric features has a first dielectric thickness, and the second one of the dielectric features has a second dielectric thickness different from the first dielectric thickness.

2. The semiconductor structure of claim 1, wherein the first portion of the STI feature is recessed from the second portion of the STI feature such that a top surface of the first portion is lower than a top surface of the second portion by (T2−T1).

3. The semiconductor structure of claim 1, further comprising:
- a capacitor disposed in the first region, wherein the capacitor includes one of the fin active regions, one of the conductive features, and one of the dielectric layer separating the one of the conductive features from the one of the fin active regions; and
- a transistor disposed in the second region.

4. The semiconductor structure of claim 3, wherein the capacitor is a de-coupling capacitor and the transistor is a field effect transistor.

5. The semiconductor structure of claim 1, wherein the plurality of conductive features include:
- a first conductive feature disposed in the first region and having a first width W1; and
- a second conductive feature disposed in the second region and having a second width W2 less than the first width W1.

6. A semiconductor structure, comprising:
- a semiconductor substrate having a first region and a second region;
- a single fin active region formed on the semiconductor substrate that extends in the first and second regions;
- a shallow trench isolation (STI) feature formed in the semiconductor substrate and adjacent the fin active region, wherein the STI feature includes:
  - a first portion disposed in the first region and a second portion disposed in the second region, and
  - the first portion of the STI feature has a first top surface and the second portion of the STI feature has a second top surface higher than the first top surface;
- a first conductive feature formed on the fin active region and the STI feature, wherein the first conductive feature is disposed in the first region and covers the first portion of the STI feature, the first conductive feature further comprising a first width;
- a second conductive feature formed on the fin active region and the STI feature, wherein the second conductive feature is disposed in the second region, the second conductive feature further comprising a second width less than the first width;
- a first dielectric feature aligned with the first conductive feature and underlying the first conductive feature, the first dielectric feature comprising a first thickness;
- a second dielectric feature aligned with the second conductive feature and underlying the second conductive feature, the second dielectric feature comprising a second thickness different from the first thickness;
- wherein the fin active region, the first dielectric feature, and the first conductive feature are configured and coupled to form a capacitor; and
- wherein the fin active region, the second dielectric feature, and the second conductive feature are configured and coupled to form a field effect transistor.

7. The semiconductor structure of claim 6, wherein:
the fin active region is oriented in a first direction; and
the first and second conductive features are oriented in a second direction perpendicular to the first direction.

8. The semiconductor structure of claim 1, wherein:
each of the fin active regions extends along the first and second portions of the STI feature in a first direction; and
each of the conductive features are disposed along the fin active regions and the STI features in a second direction perpendicular to the first direction.

9. The semiconductor structure of claim 1, wherein:
the first portion of the first region has a plurality of sides; and
the second portion of the second region surrounds the first portion on each of the sides.

10. The semiconductor structure of claim 9, wherein the conductive feature that covers the first and second portions of the STI feature extends out beyond all sides of the first portion to thereby cover the portion of the second portion of the STI feature in the second region.

11. A semiconductor structure, comprising:
- a semiconductor substrate having a first region and a second region;
- a shallow trench isolation (STI) feature formed in the semiconductor substrate, wherein the STI feature comprises a first portion disposed in the first region and having a first thickness T1 and a second portion disposed in the second region and having a second thickness T2 greater than the first thickness T1, the first portion of the STI feature being recessed from the second portion of the STI feature;
- a plurality of fin active regions on the semiconductor substrate;
- a plurality of conductive features disposed on the fin active regions and the STI feature,
- wherein one of the conductive features covers the first portion of the STI feature in the first region and a portion of the second portion of the STI feature in the second region;
- wherein the plurality of conductive features further comprise:
  - a first conductive feature disposed in the first region and having a first width W1; and
  - a second conductive feature disposed in the second region and having a second width W2 less than the first width W1; and
- a plurality of dielectric features underlying the conductive features and separating the conductive feature from the fin active regions, wherein the plurality of dielectric features comprise:
  - a first dielectric feature disposed in the first region, underlying the first conductive feature, and having a first dielectric material; and
  - a second dielectric feature disposed in the second region, underlying the second conductive feature, and having a second dielectric material different from the first dielectric material.

12. The semiconductor structure of claim 11, wherein:
the first conductive feature, the first dielectric feature, and a first subset of the fin active regions are configured to form a capacitor; and
the second conductive feature, the second dielectric feature, and a second subset of the fin active regions are configured to form a fin field effect transistor (FinFET).

13. A semiconductor structure, comprising:
- a semiconductor substrate having a first region and a second region;
- a single fin active region formed on the semiconductor substrate that extends in the first and second regions;
- a shallow trench isolation (STI) feature formed in the semiconductor substrate and adjacent the fin active region, wherein the STI feature comprises:
  - a first portion disposed in the first region and a second portion disposed in the second region, and
  - the first portion of the STI feature has a first top surface and the second portion of the STI feature has a second top surface higher than the first top surface;
- a first conductive feature formed on the fin active region and the STI feature, wherein the first conductive feature is disposed in the first region and covers the first portion of the STI feature, the first conductive feature further comprising a first width;

a second conductive feature formed on the fin active region and the STI feature, wherein the second conductive feature is disposed in the second region, the second conductive feature further comprising a second width less than the first width;

a first dielectric feature aligned with the first conductive feature and underlying the first conductive feature, the first dielectric feature further comprising a first dielectric material;

a second dielectric feature aligned with the second conductive feature and underlying the second conductive feature, the second dielectric feature further comprising a second dielectric material different from the first dielectric material;

wherein the fin active region, the first dielectric feature, and the first conductive feature are configured and coupled to form a capacitor; and wherein the fin active region, the second dielectric feature, and the second conductive feature are configured and coupled to form a field effect transistor.

* * * * *